US012805304B2

(12) United States Patent
Wei et al.

(10) Patent No.: US 12,805,304 B2
(45) Date of Patent: Nov. 17, 2026

(54) METHOD FOR FABRICATING A SEMICONDUCTOR STRUCTURE

(71) Applicant: ChangXin Memory Technologies, Inc., Hefei City (CN)

(72) Inventors: Jun Wei, Hefei City (CN); Dong Yan, Hefei City (CN); Taoyan Yan, Hefei City (CN); Donghe Bai, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 466 days.

(21) Appl. No.: 18/547,073

(22) PCT Filed: Jul. 21, 2022

(86) PCT No.: PCT/CN2022/107192
§ 371 (c)(1),
(2) Date: Aug. 18, 2023

(87) PCT Pub. No.: WO2024/011650
PCT Pub. Date: Jan. 18, 2024

(65) Prior Publication Data

US 2025/0022749 A1 Jan. 16, 2025

(30) Foreign Application Priority Data

Jul. 12, 2022 (CN) ......................... 202210814687.7

(51) Int. Cl.
*H10W 20/46* (2026.01)
*H10B 12/00* (2023.01)
*H10W 20/00* (2026.01)

(52) U.S. Cl.
CPC ............ *H10W 20/46* (2026.01); *H10B 12/01* (2023.02); *H10W 20/072* (2026.01); *H10W 20/098* (2026.01)

(58) Field of Classification Search
CPC .......................... H10W 20/072; H10W 20/098
See application file for complete search history.

(56) References Cited

U.S. PATENT DOCUMENTS 5,441,909 A * 8/1995 Kim .................... H10B 12/033 257/E21.648
2001/0051423 A1 12/2001 Kim et al.
(Continued)

FOREIGN PATENT DOCUMENTS

CN 112736022 B 5/2022

OTHER PUBLICATIONS

PCT/CN2022/107192 International Search Report mailed Dec. 22, 2022.

*Primary Examiner* — Brian Turner
(74) *Attorney, Agent, or Firm* — SYNCODA LLC; Feng Ma

(57) ABSTRACT

The disclosed semiconductor structure includes a conductive layer, a channel in the conductive layer. The inner wall of the channel is covered with a first dielectric layer. The thickness of the first dielectric layer is greater at the orifice of the channel than the thickness on the side away from the orifice; the first dielectric layer on the side close the orifice is covered with a second dielectric layer, and the second dielectric layer blocks the orifice; an air gap is formed in the first dielectric layer and the second dielectric layer, and the size of the air gap on the side away from the orifice is larger than the size of the air gap on the side close to the orifice. The present application can effectively reduce the parasitic capacitance of the conductive connection structure, alleviate
(Continued)

its RC delay problem, and optimize the storage performance of the memory.

5 Claims, 7 Drawing Sheets

(56) References Cited

U.S. PATENT DOCUMENTS

| | | | | |
|---|---|---|---|---|
| 2012/0280300 | A1* | 11/2012 | Kim | H10B 41/35<br>257/315 |
| 2015/0262929 | A1* | 9/2015 | Hsiao | H10W 20/072<br>438/618 |
| 2016/0133577 | A1* | 5/2016 | Baek | H10W 20/033<br>257/751 |
| 2016/0372419 | A1 | 12/2016 | Tsunemine et al. | |
| 2021/0043569 | A1* | 2/2021 | Lu | H10W 20/20 |

* cited by examiner

METHOD FOR FABRICATING A SEMICONDUCTOR STRUCTURE

CROSS REFERENCES TO RELATED APPLICATIONS

This application claims the benefit of priority of Chinese patent application with the application No. 202210814687.7, entitled "Semiconductor Structure And Method For Fabricating The Same", filed on Jul. 12, 2022 with the China Patent Office, the contents of which are incorporated herein by reference in its entirety.

TECHNICAL FIELD

The present application relates to the technical field of semiconductor manufacturing, and in particular to a semiconductor structure and a method for preparing the semiconductor structure.

BACKGROUND

Dynamic Random Access Memory (DRAM for short) is a commonly used semiconductor storage device, which includes multiple repeated storage units. Each memory cell generally includes a transistor and a capacitor. The gate of the transistor is connected to a word line (WL), the drain is connected to a bit line (BL), and the source is connected to the capacitor.

A conductive connection structure is provided in the DRAM memory, and the conductive connection structure may be a metal interconnection structure or a contact plug structure. Wherein, the metal interconnection structure is used for connecting signal lines of different storage units, or used for connecting different conductive layers in the storage units. In order to adapt to the continuous shrinking of the size of the DRAM memory, the size of the conductive connection structures in the related art and the distance between adjacent conductive connection structures are correspondingly reduced continuously.

However, the parasitic capacitance of the conductive connection structure in the above solution is relatively large, resulting in serious capacitance resistance (RC) delay, which affects the storage performance of the DRAM memory.

SUMMARY

In a first embodiment, the present application provides a semiconductor structure, having a conductive layer. There is a hole in the conductive layer. The inner wall of the hole is covered with a first dielectric layer. The thickness of the first dielectric layer on the side of the hole near the hole is greater than that away from the hole. The thickness of the first dielectric layer on the side of the mouth; the first dielectric layer on the side close to the orifice is covered with a second dielectric layer, and the second dielectric layer blocks the orifice:

Air gaps are formed in the first dielectric layer and the second dielectric layer, and the size of the air gap on the side away from the orifice is larger than the size of the air gap on the side close to the orifice.

In a second embodiment, the present application provides a method for preparing a semiconductor structure, including:

providing a conductive layer having channels;

forming a first dielectric layer, the first dielectric layer covers at least the inner wall of the channel, and the thickness of the first dielectric layer on the side close to the orifice of the channel is greater than the thickness of the first dielectric layer on the side away from the orifice;

forming a barrier layer, the barrier layer covers at least the first dielectric layer on the side near the orifice of the channel;

removing the partial thickness of the first dielectric layer not covered by the barrier layer;

remove the barrier layer; and forming a second dielectric layer, the second dielectric layer covers at least the first dielectric layer on the side close to the orifice, and blocks the orifice of the channel:

Air gaps are formed in the first dielectric layer and the second dielectric layer, wherein the size of the air gaps on the side away from the orifice is larger than the size of the air gaps on the side close to the orifice.

EXPLANATION OF REFERENCE NUMERALS

Figure 1:
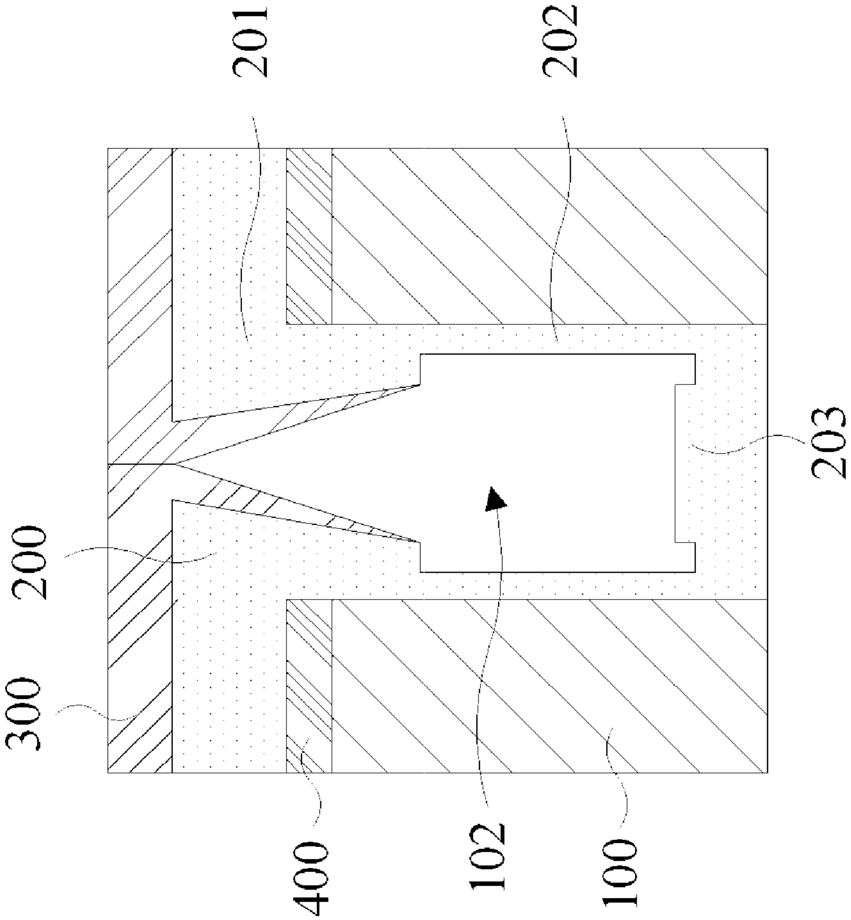
FIG. 1 is a schematic diagram of a semiconductor structure according to an embodiment of the present application.

100, conductive layer: 101, channel: 101*a*, orifice: 102, air gap: 200, first dielectric layer: 201, first part: 202, second part: 202*a*, second part before etching: 203, third part: 300, the second dielectric layer: 400, the third dielectric layer: 500, the barrier layer.

DETAILED DESCRIPTION OF THE PREFERRED EMBODIMENTS

The inventors of the present application learned in their experiments that the DRAM memory includes multiple repetitive storage units to realize the storage function. The DRAM memory includes conductive connection structure, and the conductive connection structure may be a metal interconnection structure or a contact plug structure. Wherein, the metal interconnection structure is used to connect signal lines of different storage units, and the contact plug connects different conductive layers in the storage unit. With the improvement of the integration level of DRAM memory, the size of DRAM memory keeps shrinking, and the size of conductive connection structures and the distance between adjacent conductive connection structures are correspondingly reduced continuously.

However, the parasitic capacitance of the conductive connection structure after shrinking in size is relatively large, resulting in serious capacitance resistance (RC) delay, which affects the storage performance of the DRAM memory. In the related art, the problem of adjusting the parasitic capacitance of the conductive connection structure is solved by reducing the resistance of the conductive connection structure or changing the filling medium in the conductive connection structure. In process of reducing the resistance of the conductive connection structure, it is difficult to adjust parameters related to resistance such as the material and cross-sectional area of the conductive connection structure in the DRAM memory.

Therefore, changing the filling medium in the conductive connection structure can be a means to adjust its parasitic capacitance, this technique is based on the low dielectric constant of air (dry air dielectric constant is 2.1). Based on this fact, adjusting the air gap structure in the conductive connection structure by increasing the size of the air gap and increasing the amount of air fill can be some effective method to reduce the parasitic capacitance of the conductive connection structure.

In view of this, in the semiconductor structure and the method for preparing the semiconductor structure according to the embodiments of the present application, in the semiconductor structure, by providing a conductive layer with holes, the conductive layer can transmit signals, so as to realize the conductive connection function of the semiconductor structure. The air pores in the layer can form subsequent air gaps. By arranging the first dielectric layer and the second dielectric layer on the inner wall of the channel, the second dielectric layer seals the orifice to form an air gap in the first dielectric layer and the second dielectric layer. By making the thickness of the first dielectric layer near the orifice side of the channel larger than the thickness of the first dielectric layer on the side away from the orifice, the size of the air gap on the side away from the orifice is larger than that on the side near the orifice. In addition, in the semiconductor manufacturing method, the blocking layer is used for mask etching to remove part of the thickness of the first dielectric layer, so that the thickness of at least part of the second dielectric layer on the side away from the hole is smaller. In this way, the size of the air gap in the semiconductor structure can be effectively increased, and the filled amount of air in the air gap can be increased, thereby alleviating the problems of parasitic capacitance and RC delay of the semiconductor structure. When the semiconductor structure is applied to a memory, it can also be optimized accordingly memory storage performance.

To further clarify the goal, technical solutions and advantages of the present application, the embodiments of the present application will be described in more detail below in conjunction with the drawings in the preferred embodiments of the present application. In the drawings, the same or similar reference numerals denote the same or similar components or components having the same or similar functions throughout. The described embodiments are some, but not all, embodiments of the application. The embodiments described below by referring to the figures are exemplary, and are intended to explain the present application, and should not be construed as limiting the present application. Based on the embodiments in this application, all other embodiments obtained by persons of ordinary skill in the art without creative efforts fall within the protection scope of this application. Embodiments of the present application will be described in detail below in conjunction with the accompanying drawings.

Figure 3:
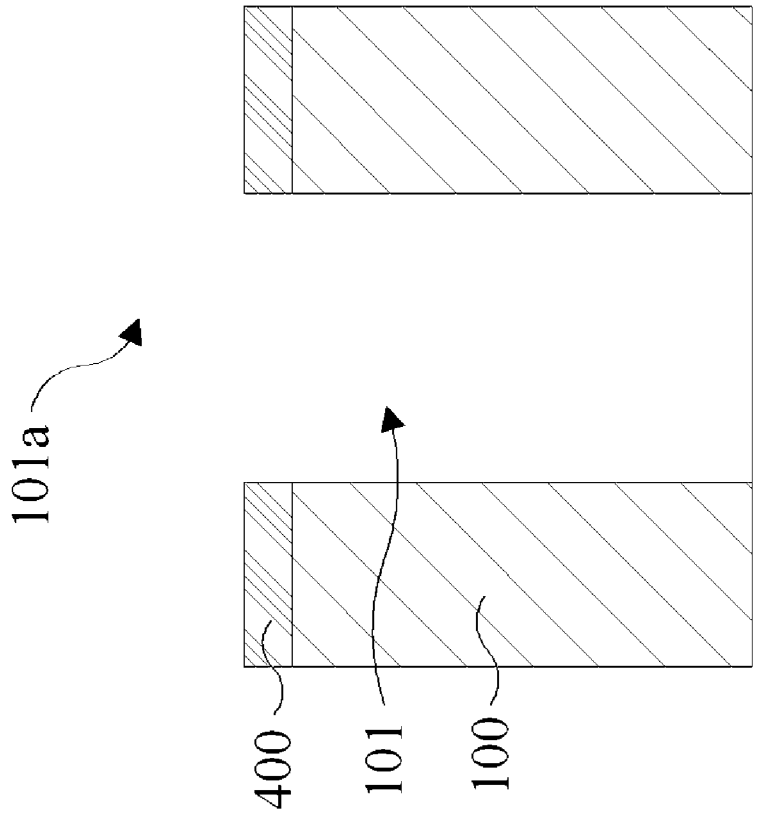
FIG. 3 shows a schematic view of a conductive layer during fabricating a semiconductor structure according to an embodiment of the present application.

FIG. 1 is a schematic structural diagram of a semiconductor structure according to an embodiment of the present application, and FIG. 3 is a schematic structural diagram of providing a conductive layer in a method for preparing a semiconductor structure according to an embodiment of the present application. As shown in FIG. 1 and FIG. 3, in the first embodiment, the semiconductor structure provided by the embodiment of the present application includes a conductive layer 100, the conductive layer 100 has a channel 101 inside, and the inner wall of the channel 101 is covered with a first dielectric layer 200, which is close to the channel 101. The thickness of the first dielectric layer 200 on the side of the orifice 101*a* is greater than the thickness of the first dielectric layer 200 on the side away from the orifice 101*a*: the first dielectric layer 200 on the side near the orifice 101*a* is covered with a second dielectric layer 300. The second dielectric layer 300 blocks the orifice 101*a:*

An air gap 102 is formed in the first dielectric layer 200 and the second dielectric layer 300, and the size of the air gap 102 on the side away from the orifice 101*a* is larger than the size of the air gap 102 on the side close to the orifice 101*a*.

It should be noted that the semiconductor structure according to the present application may be an interconnection structure (such as a metal interconnection line) or a plug structure (such as a metal plug). When the semiconductor structure is applied to a memory, signal lines between different storage units in the memory can usually be connected through the interconnection structure, so as to realize signal transmission of multiple storage units. Alternatively, the capacitor in the storage unit is arranged above the transistor, and a plug structure is arranged between the transistor and the capacitor for connecting the capacitor to the drain of the transistor. In other embodiments, the semiconductor structure can also be used for other connection requirements, which is not limited in this embodiment.

Wherein, the conductive layer 100 may be a metal aluminum layer, or a metal copper layer. The holes 101 of the conductive layer 100 can be formed by mask etching. The first dielectric layer 200 formed in the channel 101 may be located on the side wall and the bottom wall of the channel 101. The first dielectric layer 200 can be formed by deposition, for example, chemical vapor deposition (CVD for short). In the process based on chemical vapor deposition, when the deposited layer is thick, the problem of step coverage becomes more obvious. In the embodiment of the present application, by virtue of the characteristics of the chemical vapor deposition process, in the process of forming the first dielectric layer 200, compared with the deposition rate of the first dielectric layer 200 on the side away from the orifice 101*a* of the channel 101, the deposition rate of the first dielectric layer 200 on the side of the orifice 101*a* is relatively large, so are the pores near the channel 101. Therefore, the thickness of the formed first dielectric layer 200 is not equal to that at the position away from the orifice 101*a* and near the orifice 101*a*, specifically, the thickness of the first dielectric layer 200 near the orifice 101*a* side of the channel 101 is greater than the thickness of the first dielectric layer 200 on the side away from the orifice 101*a*.

Figure 4:
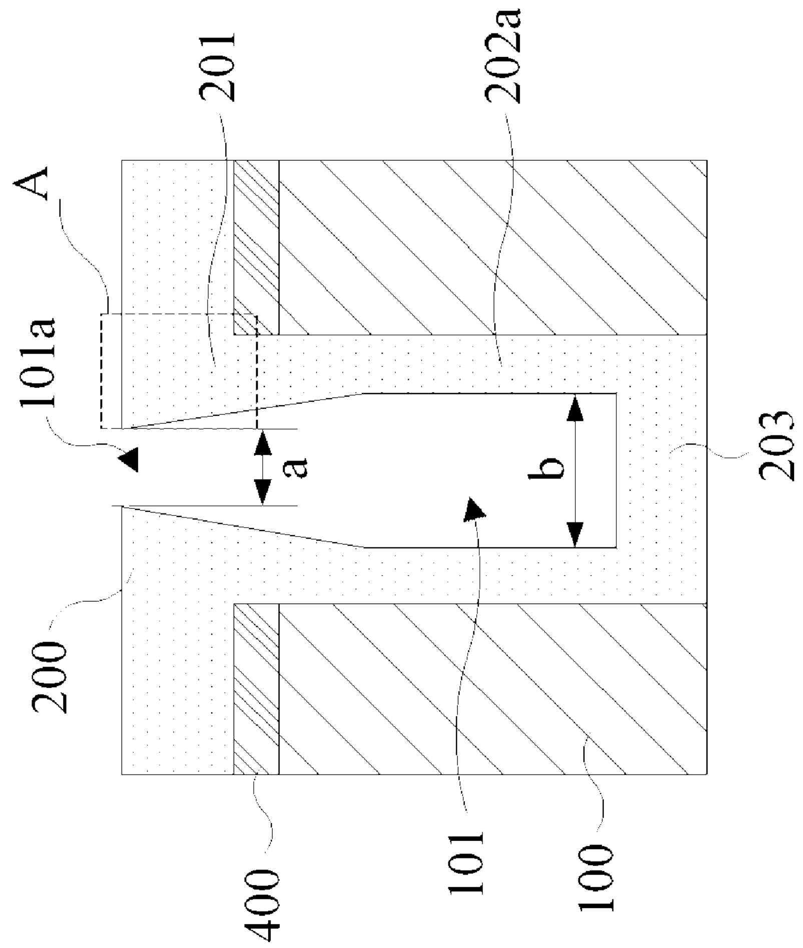
FIG. 4 is a schematic structural view of a first dielectric layer during fabricating a semiconductor structure according to an embodiment of the present application.

In this way, the first dielectric layer 200 near the orifice 101*a* can form an "overhang structure (overhang)". FIG. 4 is a schematic structural diagram of forming a first dielectric layer 200 in a method for manufacturing a semiconductor structure according to an embodiment of the present application. Referring to FIG. 4, the "overhanging structure" may be the part shown in A in FIG. 4, the overhanging structure is close to the orifice 101*a* of the hole 101, so that the minimum dimension a of the orifice 101*a* is smaller than the dimension b at 101 on the side away from the orifice 101*a*.

It should be explained that the concept of "dimension" in the embodiment of the present application may refer to the extension length of the channel 101 along the direction perpendicular to the direction approaching and away from the orifice 101*a* in the cross-sectional view of FIG. 4 as an example, that is. FIG. 4 The dimensions marked in a and b. Of course, in other embodiments, the concept of "size" may also be the cross-sectional area of the channel 101 along the direction perpendicular to approaching and away from the orifice 101*a*. However, it should be noted that, in this embodiment, when comparing the sizes of different positions of the channel 101, the comparison needs to be carried out in the same size concept.

The first dielectric layer 200 near the orifice 101*a* is covered with a second dielectric layer 300, and the second dielectric layer 300 blocks the orifice 101*a*. Wherein, based on the thickness of the first dielectric layer 200 on the side close to the orifice 101*a* is relatively large, the second dielectric layer 300 covering the first dielectric layer 200 close to the orifice 101*a* can block the orifice 101*a* to ensure that A structurally stable air gap 102 is formed in the channel 101. The air gap 102 may be filled with dry air, and the semiconductor structure of the present application may be completed in an environment of dry air during the manufacturing process, and the prepared air gap 102 is naturally filled with dry air. The dielectric constant of the semiconductor structure can be adjusted by using dry air to reduce its parasitic capacitance, thereby effectively alleviating the problem of RC delay and ensuring that when the semiconductor structure is applied to a memory, the storage performance of the memory is improved.

In the semiconductor structure of the present application, the first dielectric layer 200 may be a tetraethyl silicate layer (TEOS).

In some embodiments, the thickness of the second dielectric layer 300 on the side close to the orifice 101*a* is greater than the thickness of the second dielectric layer 300 on the side away from the orifice 101*a*. The second dielectric layer 300 can be formed by a deposition process, and a thicker second dielectric layer 300 is formed on the side close to the orifice 101*a*, so that the second dielectric layer 300 on the side close to the orifice 101*a* can effectively block the orifice 101*a*, thereby forming a stable air gap 102 structure; and forming a thinner second dielectric layer 300 on the side away from the orifice 101*a*, so as to increase the size of the air gap 102 in the channel 101 and improve the filling of air in the air gap 102 The amount helps to alleviate the problem of large parasitic capacitance of the semiconductor structure.

Moreover, based on the fact that the first dielectric layer 200 and the second dielectric layer 300 have larger thicknesses on the side near the orifice 101*a*, the formed air gap 102 has a larger size on the side near the orifice 101*a*.

Wherein, the thickness of the second dielectric layer 300 gradually decreases along the direction away from the orifice 101*a*, and the size of the air gap 102 in the second dielectric layer 300 gradually increases along the direction away from the orifice 101*a*. Since the second dielectric layer 300 is formed through a deposition process, the step coverage of the deposition of the second dielectric layer 300 gradually changes along the direction away from the orifice 101*a*, so that the thickness of the second dielectric layer 300 will also gradually decrease, correspondingly, the size of the air gap 102 in the second dielectric layer 300 gradually increases, so that the flatness of the surface of the second dielectric layer 300 close to the air gap 102 can be effectively ensured to improve the structure of the second dielectric layer 300 Regularity.

Continuing to refer to FIG. 1, the first dielectric layer 200 located in the channel 101 includes a first part 201 and a second part 202, the first part 201 is close to the orifice 101*a*, and the second part 202 is away from the orifice 101*a*. The thickness of the first part 201 is greater than the thickness of the second part 202. The first part 201 and the second part 202 can both be located at the sidewall position of the channel 101, the first part 201 and the second part 202 can be different parts of the first dielectric layer 200, and one end of the first part 201 close to the second part 202 is in the second Section 202 is connected. In this embodiment, the first part 201 may be a portion with a gradually changing thickness of the second dielectric layer 300 in FIG. 1, and the second part 202 may be a portion far away from the opening 101 *a* with a smaller thickness. In FIG. 1, the transition position between the first part 201 and the second part 202 has a stepped structure. In other embodiments, the transition between the first part 201 and the second part 202 may also be a smooth surface, which is not limited in this embodiment.

Figure 6:
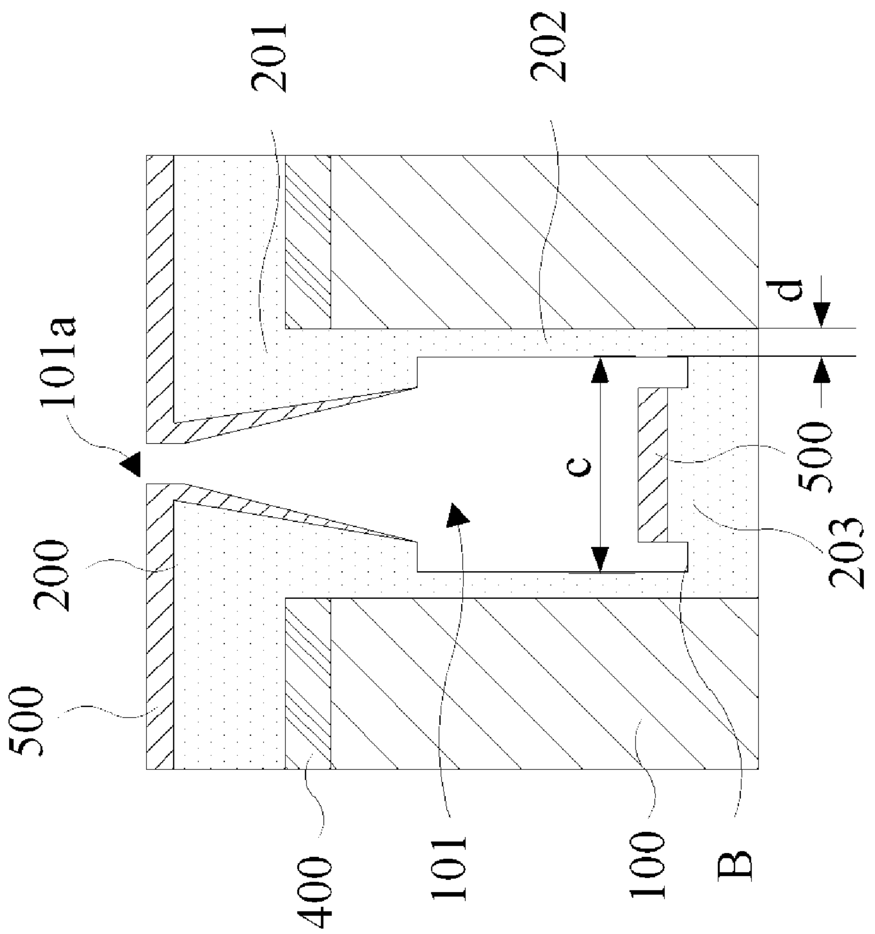
FIG. 6 is a schematic structural view of the first dielectric layer with a partial thickness removed during fabricating a semiconductor structure according to the embodiment of the present application.

Specifically, the thickness range of the second part 202 in the embodiment of the present application is 5-10 nm. FIG. 6 is a schematic structural view of the first dielectric layer 200 with part of the thickness removed in the semiconductor structure manufacturing method provided by the embodiment of the present application. Referring to FIG. 6, the thickness of the second part 202 may be the portion indicated by d.

In the present application, setting the thickness of the second part 202 on the side away from the orifice 101*a* to be smaller can effectively increase the size of the air gap 102, thereby increasing the air filling amount in the air gap 102. Therefore, the thickness of the second part 202 is reduced, which helps to adjust the parasitic capacitance of the semiconductor structure. However, when the thickness of the second part 202 is too small, the anti-interference ability of the electrical signal of the semiconductor structure is reduced. When a semiconductor structure is applied to a memory, as the size of the memory decreases, the distance between two adjacent semiconductor structures decreases, and electrical signal interference between them will affect their own signal transmission. Therefore, it is necessary to ensure that the second dielectric layer 300 has a certain thickness in the semiconductor structure, so as to ensure the anti-interference ability of the electrical signal of the semiconductor structure. In some feasible embodiments, the thickness of the second part 202 may be 6 nm, 7 nm or 8 nm, and the specific value of the thickness of the second part 202 is not limited in this embodiment.

Based on the above-mentioned first dielectric layer 200 including the first part 201 and the second part 202, the second dielectric layer 300 can be covered on the first part 201, so that the second dielectric layer 300 is arranged closer to the orifice 101*a*, so as to plug the hole Mouth 101*a*. Based on the fact that the thickness of the first part 201 is greater than that of the second part 202, and the first part 201 is also covered with the second dielectric layer 300, therefore, the size of the air gap 102 in the second part 202 is larger than that of the air gap in the first part 201. The size of the gap 102. In this way, the position where the air gap 102 is larger is far from the position of the orifice 101*a*, which can ensure the structural stability of the air gap 102 and the position of the orifice 101*a*. Wherein, the size of the air gap 102 formed in the second part 202 can be the part shown in c in FIG. a and b.

Specifically, the thickness of the first part 201 near the orifice 101*a* is greater than the thickness of the first part 201 away from the orifice 101*a*; and, the thickness of the first part 201 gradually decreases along the direction away from the orifice 101*a*. Since the first dielectric layer 200 is formed by a chemical vapor deposition process, the first part 201 of the first dielectric layer 200 is also affected by the step coverage, so that the thickness of the side near the orifice 101*a* is greater than the thickness of the side away from the orifice 101*a*. The thickness of the first part 201 gradually decreases along the direction away from the orifice 101*a*, which can also ensure the surface smoothness of the first dielectric layer 200 near the orifice 101*a*.

Referring to FIG. 1, the first dielectric layer 200 includes a third part 203 covering at least part of the bottom of the channel 101, and the thickness of the third part 203 is greater than that of the second part 202. The third part 203 is located at the bottom of the channel 101, and the thickness of the third part 203 is greater than that of the second part 202, which can ensure the anti-interference ability of the electrical signal of the semiconductor structure. When this semiconductor structure is applied to a memory, as the size of the memory decreases and the distance between adjacent semiconductor structures decreases, the thickness of the third part 203 at the bottom of the hole 101 is relatively large, which can effectively avoid the gap between adjacent semiconductor structures. Electrical signal interference.

Based on the above descriptions of the first part 201 and the second part 202, this application sets the first dielectric layer 200 near the middle of the channel 101 in the semiconductor structure to be thinner (that is, the thickness of the second part 202 is smaller), which can effectively enlarge the size of the air gap 102 to avoid affecting the structural stability of the semiconductor structure. The first dielectric layer 200 near the orifice 101*a* and the bottom of the hole is set thicker (that is, the thickness of the first part 201 and the third part 203 is relatively large), which can effectively improve the structural stability and electrical performance stability of the semiconductor structure.

As a realizable implementation, the materials of the first dielectric layer 200 and the second dielectric layer 300 in this application can be the same, which can reduce the difficulty of manufacturing the semiconductor structure and ensure the interfacial stability of the contact surface between the first dielectric layer 200 and the second dielectric layer 300. Materials for both include silicon oxide and/or germanium oxide.

In the semiconductor structure of the present application, a third dielectric layer 400 may be further included. The third dielectric layer 400 is located outside the channel 101, and the third dielectric layer 400 covers the conductive layer 100 near the orifice 101*a*. The third dielectric layer 400 may be a titanium nitride layer.

As some realizable implementations, at least part of the first dielectric layer 200 is located outside the channel 101, and the first dielectric layer 200 located outside the channel 101 covers the third dielectric layer 400.

At least part of the second dielectric layer 300 is located outside the channel 101, and the second dielectric layer 300 located outside the channel 101 covers the first dielectric layer 200. The top surface of the first dielectric layer 200 outside the channel 101 may be flat, which facilitates the installation of the second dielectric layer 300 outside the channel 101 and ensures the stability of the second dielectric layer 300.

Figure 2:
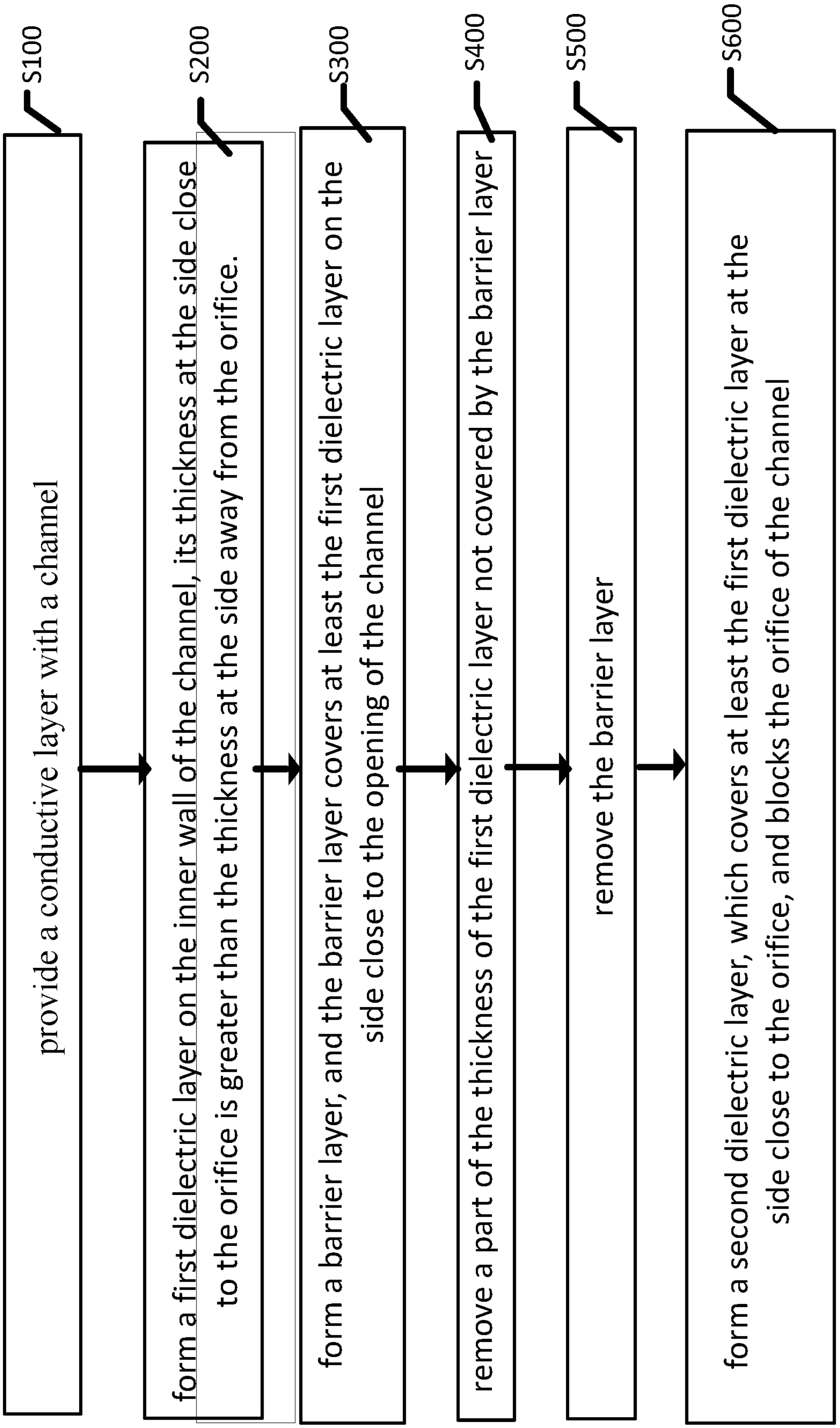
FIG. 2 illustrates a schematic flow diagram of a method for fabricating a semiconductor structure according to an embodiment of the present application.

FIG. illustrates a schematic flow diagram of a method for fabricating a semiconductor structure according to an embodiment of the present application. Referring to FIG. 2, the second embodiment, provides a method for preparing a semiconductor structure, including:

S100: provide a conductive layer with a channel. As shown in FIG. 3, the conductive layer 100 can be formed by deposition, and the conductive layer 100 can be made of aluminum or copper, so that the conductive layer 100 has signal transmission capability. The present embodiment does not limit the material of the conductive layer 100. Wherein, the hole 101 in the conductive layer 100 can be formed by etching.

S200: form a first dielectric layer, the first dielectric layer covers at least the inner wall of the channel, and the thickness of the first dielectric layer at the side close to the orifice of the channel is greater than the thickness of the first dielectric layer at the side away from the orifice. As shown in FIG. 4, forming the first dielectric layer 200 includes:

a first dielectric layer 200 formed by a chemical vapor deposition process.

It should be noted that the chemical vapor deposition process has the characteristics of step coverage when the deposition thickness is relatively large, so this application can apploes this characteristic to arrange the thickness of the first dielectric layer 200 formed on the side close to the orifice 101*a* relatively large, and the thickness of the first dielectric layer 200 on the side away from the orifice 101*a* relatively small.

Wherein, the first dielectric layer 200 includes a first part 201 near the hole 101 *a* and a third part 203 at the bottom of the hole 101. During the deposition process of the first dielectric layer 200, the position of the orifice 101*a* is closer to the deposition evaporation source relative to the bottom of the hole, so the formed first part 201 near the orifice 101*a* will appear close. The thickness of the first part 201 on the side of the orifice 101*a* is greater than the thickness of the first part 201 on the side away from the orifice 101*a*. In FIG. 4, a shows the size of the orifice 101*a*, that is, the size of the air gap 102 near the orifice 101*a*, the size of the air gap 102 away from the orifice 101*a*, and b is larger than a.

Also, the thickness of the first part 201 gradually decreases in a direction away from the orifice 101*a*. In this way, the flatness of the surface of the first part 201 close to the air gap 102 can be ensured.

In the direction along the plane where the bottom of the hole is located, the third parts 203 may be evenly distributed, that is, the thicknesses of the third parts 203 at each position of the bottom of the hole may be substantially equal.

Figure 5:
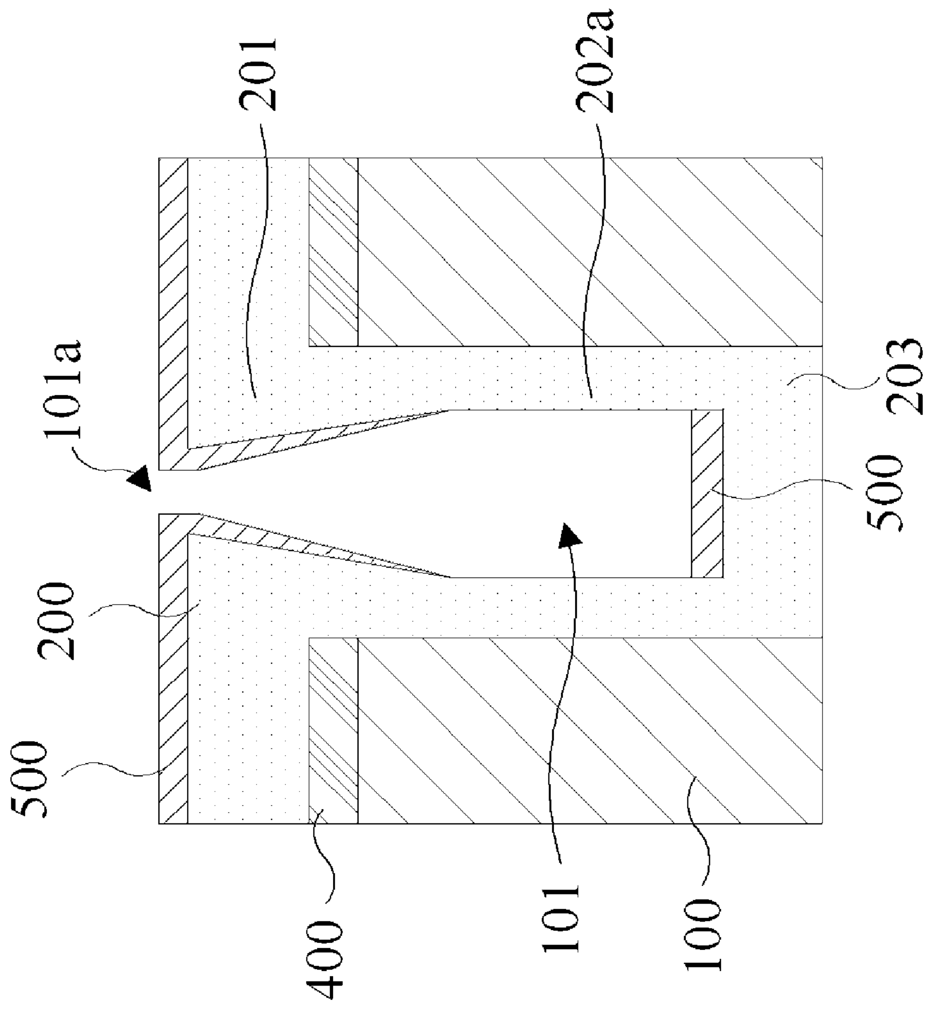
FIG. 5 is a schematic structural view of a barrier layer during fabricating a semiconductor structure according to an embodiment of the present application.

S300: form a barrier layer, and the barrier layer covers at least the first dielectric layer on the side close to the opening of the channel. FIG. 5 is a schematic structural diagram of forming a barrier layer 500 in a method for preparing a semiconductor structure according to an embodiment of the present application. Referring to FIG. 5, forming the barrier layer 500 may include:

The barrier layer 500 is formed through a physical vapor deposition process. The physical vapor deposition process (Physical Vapor Deposition, referred to as PVD) has obvious characteristics of step coverage. In this application, the step coverage difference of the physical vapor deposition process is used to make the thickness of the barrier layer 500 near the hole 101 *a* larger than the thickness of the barrier layer 500 away from the hole 101 *a*.

The barrier layer 500 may cover the first dielectric layer 200 close to the opening 101 *a*, that is, the first part 201. Based on the thickness of the first part 201 on the side near the orifice 101*a*, it is greater than the thickness of the first part 201 on the side away from the orifice 101*a*, and the thickness of the barrier layer 500 is larger on the side near the orifice 101*a*, and is far from the side of the orifice 101*a*. The thickness is smaller. Therefore, after the barrier layer 500 is formed, the size of the channels 101 on the side close to the orifice 101*a* is smaller than the size of the channels 101 on the side away from the orifice 101*a*. The barrier layer 500 can effectively protect the first dielectric layer 200 near the orifice 101*a*, and avoid affecting the thickness of the first dielectric layer 200 on the side near the orifice 101*a* in the subsequent process of removing part of the thickness of the first dielectric layer 200, so as to effectively prevent subsequent steps from enlarging the size of the orifice 101*a* of the channel 101 and ensure the stability of the formed air gap 102 structure.

As a possible implementation, the thickness of the barrier layer 500 gradually decreases along the direction away from the orifice 101*a*. Since the barrier layer 500 is formed by deposition, the thickness gradually decreases along the direction away from the orifice 101*a*, which can ensure the smoothness of the wall surface of the barrier layer 500 near the channel 101.

In the embodiment of the present application, the material of the barrier layer 500 may include but not limited to titanium nitride. The material of the barrier layer 500 can be selected from a material different from that of the first dielectric layer 200, and the selective etching ratio of the two for the same chemical etching solution is different, so as to facilitate the subsequent removal of part of the thickness of the first dielectric layer 200 and the removal of the barrier layer 500 and so on.

Referring to FIG. 5, the process of forming the barrier layer 500 in this application may further include: the barrier layer 500 covers the first part 201 and the third part 203. The barrier layer 500 can also cover the first dielectric layer 200 at the bottom of the hole, that is, the third part 203. Since the third part 203 is located at the bottom of the channel 101, it is beneficial to improve the anti-interference ability of the electrical signal of the semiconductor structure. Therefore, the barrier layer 500 is used to effectively protect the third part 203, avoid affecting the thickness of the third part 203 during the process of removing part of the thickness of the first dielectric layer 200, and improve the electrical performance stability of the semiconductor structure.

After the barrier layer 500 is formed, the method further includes: S400: remove a part of the thickness of the first dielectric layer not covered by the barrier layer. Referring to FIG. 6, this step can be completed by chemical etching.

As a realizable implementation manner, removing the part of the thickness of the first dielectric layer 200 not covered by the barrier layer 500 includes: using the first etchant to remove the part of the thickness not covered by the barrier layer 500 through a chemical etching process. For the first dielectric layer 200, the selective etching ratio of the first etchant to the barrier layer 500 and the first dielectric layer 200 is 1:10.

Wherein, the first etching solution is hydrofluoric acid solution (DHF). In the hydrofluoric acid solution, the ratio of hydrofluoric acid to water ranges from 200:1 to 300:1, and the etching process time of the first etching solution is 100-140 s. In this embodiment, the first etching solution The etching process time can be 110 s, 120 s or 130 s.

Specifically, removing the partial thickness of the first dielectric layer 200 not covered by the barrier layer 500 includes: removing the partial thickness of the first dielectric layer 200 in the first dielectric layer 200 except for the first part 201 and the third part 203, And form the second part 202 of the first dielectric layer 200. Wherein, the thicknesses of the first part 201 and the third part 203 are both greater than the thickness of the second part 202.

It should be noted that, after removing part of the thickness of the first dielectric layer 200, the remaining thickness of the first dielectric layer 200 may be the part shown in d in FIG. 6, and the size of the formed air gap 102 may be shown in c. part out.

And, after being positioned at the first dielectric layer 200 of partial thickness of channel 101 sidewalls to be removed, expose the first dielectric layer 200 of hole channel 101 hole bottoms, therefore be positioned at hole bottom place and be close to the partial thickness of channel 101 sidewalls second dielectric layer 300 is also removed, thereby forming the structure shown in part B of FIG. 6. In the channel 101 of the channel 101, the thickness of the third part 203 covered by the barrier layer 500 is greater than the thickness of the second dielectric layer 300 at the bottom of the hole and close to the sidewall of the channel 101. In this way, under the premise of having less impact on the stability of the electrical performance of the semiconductor structure, more second dielectric layers 300 can be removed, thereby increasing the size of the subsequently formed air gap 102 and increasing the filling amount of air in the air gap 102, helps to reduce the parasitic capacitance of the semiconductor structure.

The inventor found in the course of research that, compared with the semiconductor structure in which no barrier layer 500 is provided and part of the thickness of the first dielectric layer 200 is not removed, the present application sets the barrier layer 500 and removes part of the thickness of the first dielectric layer 200 After that, the size of the air gap 102 in the semiconductor structure can be increased by about 200%, and the parasitic capacitance of the semiconductor structure can be reduced by about 27%.

Figure 7:
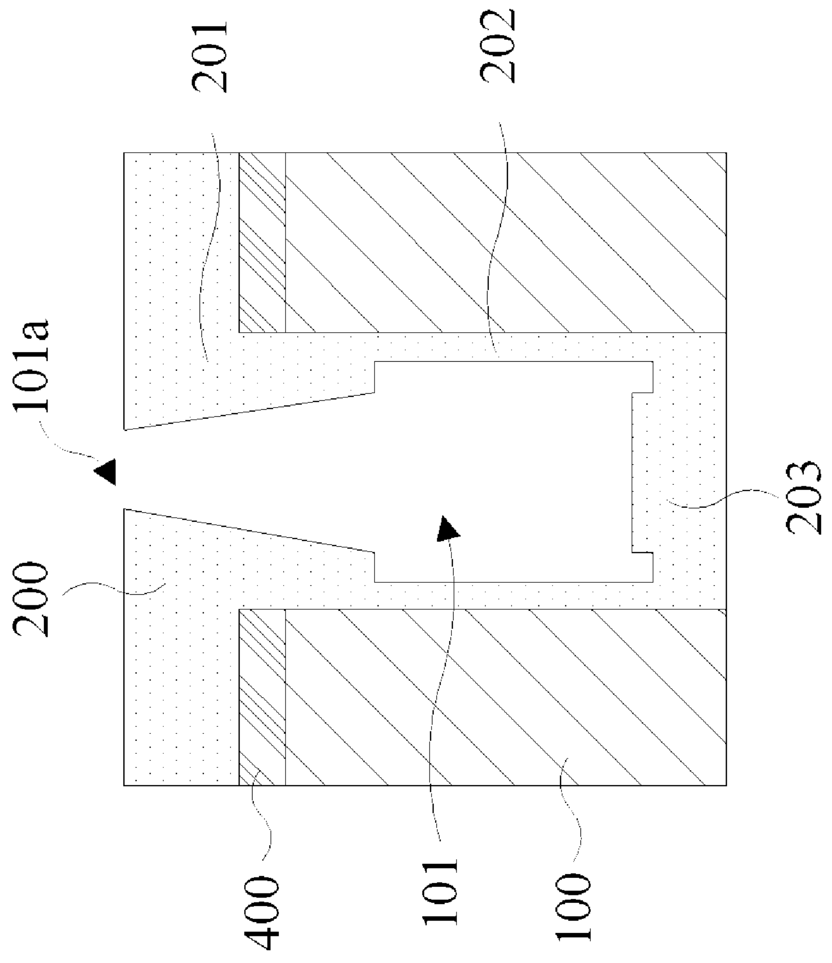
FIG. 7 is a schematic structural view after removing the barrier layer during fabricating a semiconductor structure according to an embodiment of the present application.

After removing part of the thickness of the first dielectric layer 200, the method may further include: S500: remove the barrier layer. FIG. 7 is a schematic structural diagram of removing the barrier layer 500 in the method for manufacturing a semiconductor structure provided by the embodiment of the present application. Referring to FIG. 7, removing the barrier layer 500 may expose the first part 201 and the third part 203. This process can also be accomplished by chemical etching.

As an achievable implementation manner, removing the barrier layer 500 includes: removing the barrier layer 500 through a chemical etching process using a second etchant, and selectively etching the barrier layer 500 and the first dielectric layer 200 by the second etchant. The eclipse ratio is 12:1. Wherein, the second etching solution is a mixture of ammonia, hydrogen peroxide and water (SCI), wherein the ratio of ammonia, hydrogen peroxide and water is 1:4:130, and the etching process time of the second etching solution is 40-80 s. In this embodiment, the etching process time of the second etching solution may be 50 s, 55 s or 60 s.

After the barrier layer 500 is removed, the method further includes: S600: form a second dielectric layer, the second dielectric layer covers at least the first dielectric layer at the side close to the orifice, and blocks the orifice of the channel.

Wherein, air gaps 102 are formed in the first dielectric layer 200 and the second dielectric layer 300, and the size of the air gaps 102 on the side away from the orifice 101*a* is larger than the size of the air gaps 102 on the side close to the orifice 101*a*.

As shown in FIG. 1, the second dielectric layer 300 may be formed by deposition, for example, by a chemical vapor deposition process. A thicker second dielectric layer 300 is formed near the orifice 101*a* to effectively block the orifice 101*a*. A second dielectric layer 300 with a smaller thickness is formed at a position away from the orifice 101*a*, so as to avoid occupying more space in the channel 101, so that the subsequently formed air gap 102 has a larger size for filling more air.

Wherein, the size of the air gap 102 on the side away from the orifice 101*a* is larger than the size of the air gap 102 close to the orifice 101*a*, which can effectively ensure the stability of the structure of the orifice 101*a*, and avoid the position of the orifice 101*a*. The second dielectric layer 300 or the first dielectric layer 200 is damaged and can help to improve the stability of the electrical properties of the semiconductor structure.

In some embodiments, before forming the first dielectric layer 200, further includes:

forming a third dielectric layer 400, the third dielectric layer 400 is located outside the channel 101 and covers the conductive layer 100 near the orifice 101*a:*

Wherein, at least part of the first dielectric layer 200 is located outside the channel 101, and the first dielectric layer 200 located outside the channel 101 covers the third dielectric layer 400.

It should be noted that the third dielectric layer 400 may be formed on the top surface of the conductive layer 100 without the holes 101, and part of the third dielectric layer 400 and part of the thickness of the conductive layer 100 are removed by etching, so that the conductive layer A channel 101 is formed in 100. Alternatively, it can be completed after forming the conductive layer 100 with the holes 101, and the third dielectric layer 400 only covers the top surface of the conductive layer 100 and does not fill the holes 101.

The top surface of the first dielectric layer 200 located outside the channel 101 may be a plane, which may facilitate subsequent setting of the second dielectric layer 300 located outside the channel 101.

Specifically, the barrier layer 500 is formed, including:

At least part of the barrier layer 500 is located outside the channel 101, and the barrier layer 500 located outside the channel 101 covers the first dielectric layer 200. In this way, it can be effectively ensured that the first etching solution is prevented from contacting the third dielectric layer 400 outside the channel 101 during the process of removing part of the thickness of the first dielectric layer 200, so as to ensure the stability of the semiconductor structure. The barrier layer 500 outside the channel 101 can be formed by simultaneous deposition with the barrier layer 500 inside the channel 101.

Wherein, at least part of the second dielectric layer 300 is located outside the channel 101, and the second dielectric layer 300 located outside the channel 101 covers the first dielectric layer 200. In this way, it can be ensured that the second dielectric layer 300 completely blocks the opening 101 *a* to ensure the structural stability of the air gap 102, and the second dielectric layer 300 can also protect the third dielectric layer 400. Similarly, the second dielectric layer 300 outside the channel 101 and the second dielectric layer 300 inside the channel 101 can be formed by simultaneous deposition.

In a third embodiment, the embodiment of the present application further provides a memory, including the above-mentioned semiconductor structure. The memories provided herein may be memory devices or non-memory devices. The storage device may include, for example, a Dynamic Random Access Memory (DRAM), a Static Random Access Memory (SRAM), a flash memory, an Electrically Erasable Programmable Read Only Memory (EEPROM), phase change random access memory (PRAM) or magnetoresistive random access memory (MRAM). A non-memory device may be a logic device such as a microprocessor, digital signal processor, or microcontroller, or the like. The embodiment of the present application is described by taking a DRAM storage device as an example.

The foregoing semiconductor structure may be an interconnection structure or a plug structure in a three-dimensional DRAM storage device, which is not limited in this embodiment. Other technical features of the memory of the present application are the same as those of the embodiments of the above-mentioned semiconductor structure, and can achieve the same technical effect, and will not be repeated here.

It should be noted that the term "layer" used herein may refer to a material portion including a region with a certain thickness. A layer may extend over the entirety of the underlying or overlying structure, or may have an extent that is less than the extent of the underlying or overlying structure. Furthermore, a layer may be a region of a homogeneous or non-homogeneous continuous structure having a thickness less than the thickness of the continuous structure. For example, a layer may be located between the top and bottom surfaces of the continuous structure or between any pair of transverse planes at the top and bottom surfaces. Layers may extend laterally, vertically and/or along the tapered surface. A substrate may be a layer, may include one or more layers therein, and/or may have one or more layers located thereon, above, and/or below. Layers may include multiple layers. For example, interconnect layers may include one or more conductor and contact layers (in which contacts, interconnect lines, and/or vias are formed) and one or more dielectric layers.

In the above description, it should be understood that, unless otherwise clearly stipulated and limited, the terms "installation". "connection" and "connection" should be interpreted in a broad sense, for example, it can be fixed connection or indirect connection through an intermediary. Connected can be the internal communication of two elements or the interaction relationship between two elements. Those of ordinary skill in the art can understand the specific meanings of the above terms in this application according to specific situations. The orientation or positional relationship indicated by the terms "upper", "lower", "front", "rear", "vertical", "horizontal", "top", "bottom", "inner", "outer" etc. is based on The orientation or positional relationship shown in the drawings is only for the convenience of describing the present application and simplifying the description, and does not indicate or imply that the referred device or element must have a specific orientation, be constructed and operated in a specific orientation, and therefore cannot be understood as Limitations on this Application. In the description of the present application, "plurality" means two or more, unless otherwise specified precisely.

The terms "first", "second", "third", "fourth", etc. (if any) in the description and claims of this application and the above drawings are used to distinguish similar objects, and not necessarily Used to describe a specific sequence or sequence. It is to be understood that the data so used are interchangeable under appropriate circumstances such that the embodiments of the application described herein, for example, can be practiced in sequences other than those illustrated or described herein. Furthermore, the terms "comprising" and "having", as well as any variations thereof, are intended to cover a non-exclusive inclusion, for example, a process, method, system, product or device comprising a sequence of steps or elements is not necessarily limited to the expressly listed instead, may include other steps or elements not explicitly listed or inherent to the process, method, product or apparatus.

Finally, it should be noted that: the above embodiments are only used to illustrate the technical solutions of the present application, and are not intended to limit it: although the application has been described in detail with reference to the foregoing embodiments, those of ordinary skill in the art should understand that: It is still possible to modify the technical solutions described in the foregoing embodiments, or perform equivalent replacements for some or all of the technical features; and these modifications or replacements do not make the essence of the corresponding technical solutions deviate from the scope of the various embodiments of the application.

The invention claimed is:

1. A method for fabricating a semiconductor structure, comprising:

providing a conductive layer comprising a channel;

forming a first dielectric layer, wherein the first dielectric layer is disposed on the inner wall of the channel, wherein a thickness of the first dielectric layer at a side close to an orifice of the channel is greater than a thickness of the first dielectric layer at a side away from the orifice of the channel;

forming a barrier layer, wherein the barrier layer is disposed on the first dielectric layer at a side close to the orifice of the channel;

removing a portion of the thickness of the first dielectric layer not under the barrier layer;

removing the barrier layer;

forming a second dielectric layer, wherein the second dielectric layer is disposed on the first dielectric layer at a side close to the orifice, and wherein the second dielectric layer blocks the orifice of the channel; and forming an air gap in the first dielectric layer and the second dielectric layer, wherein a size of the air gap at a side away from the orifice is larger than a size of the air gap at a side close to the orifice;

wherein removing the partial thickness of the first dielectric layer not under the barrier layer comprises:

using a first etchant to remove the partial thickness of the first dielectric layer not under the barrier layer through a chemical etching process, wherein the first etchant has a selective etch ratio effect on the barrier layer and the first dielectric layer of 1:10;

wherein removing the barrier layer comprises:

using a second etchant to remove the barrier layer through a chemical etching process, wherein the second etchant has a selective etch ratio effect on the barrier layer and the first dielectric layer of 12:1;

wherein the first etchant is a hydrofluoric acid solution; wherein in the hydrofluoric acid solution, a ratio of hydrofluoric acid to water is in the range of 200:1-300:1, and wherein an etch process time of the first etchant is 100 seconds-140 seconds; and/or wherein the second etchant is a mixture of ammonia, hydrogen peroxide and water, wherein a ratio of ammonia, hydrogen peroxide and water is 1:4:130, and wherein an etch process time of the second etchant is in a range of 40 seconds-80 seconds.

2. The method for fabricating the semiconductor structure according to claim 1, wherein forming the barrier layer comprises:

forming the barrier layer by a physical vapor deposition process;

wherein, a thickness of the barrier layer at a side close to the orifice is greater than a thickness of the barrier layer at a side away from the orifice, and wherein the thickness of the barrier layer gradually decreases along the direction pointing away from the orifice.

3. The method for fabricating the semiconductor structure according to claim 1, wherein, before forming the first dielectric layer, the method further comprises:

forming a third dielectric layer, wherein the third dielectric layer is located outside the channel and covers the conductive layer close to the orifice; wherein, at least part of the first dielectric layer is located outside the channel, and the first dielectric layer located outside the channel covers the third dielectric layer;

wherein forming the barrier layer comprises:

disposing part of the barrier layer outside the channel, wherein the barrier layer disposed outside the channel covers the first dielectric layer;

wherein, at least part of the second dielectric layer is located outside the channel, wherein the second dielectric layer located outside the channel covers the first dielectric layer.

4. The method for fabricating the semiconductor structure according to claim 1, wherein the first dielectric layer comprises a first part close to the orifice and a third part at a bottom of the orifice;

wherein forming the barrier layer comprises: disposing the barrier layer on the first part and the third part of the first dielectric layer;

wherein removing a partial thickness of the first dielectric layer not under the barrier layer comprises: removing the partial thickness of the first dielectric layer from the first dielectric layer except for the first part and the third part, and forming a second part of the first dielectric layer;

and wherein, a thicknesses of the first part and a thicknesses of the third part are both greater than a thickness of the second part.

5. The method for fabricating the semiconductor structure according to claim 4, wherein forming the first dielectric layer comprises:

forming the first dielectric layer by a chemical vapor deposition process;

wherein, the thickness of the first part at the side close to the orifice is greater than the thickness of the first part at the side away from the orifice, and wherein the thickness of the first part gradually decreases along the direction pointing away from the orifice.

* * * * *